(12) United States Patent
Fei et al.

(10) Patent No.: US 6,522,273 B1
(45) Date of Patent: Feb. 18, 2003

(54) CIRCUITS SYSTEMS AND METHODS FOR POWER DIGITAL-TO-ANALOG CONVERTER PROTECTION

(75) Inventors: Xiaofan Fei, Austin, TX (US); Johann Guy Gaboriau, Austin, TX (US); Jason Powell Rhode, Austin, TX (US); John Laurence Melanson, Austin, TX (US); Eric Walburger, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 23 days.

(21) Appl. No.: 09/825,091

(22) Filed: Apr. 2, 2001

(51) Int. Cl.[7] ................................................ H03M 1/16
(52) U.S. Cl. ...................................... 341/139; 341/144
(58) Field of Search ................................. 341/139, 106, 341/118, 144

(56) References Cited

U.S. PATENT DOCUMENTS 5,365,233 A * 11/1994 Schaub ........................ 341/139

* cited by examiner

Primary Examiner—Brian Young
(74) Attorney, Agent, or Firm—James J. Murphy; Winstead Sechrest & Minick, P.C.

(57) ABSTRACT

An apparatus and method for power digital-to-analog converter protection are implemented. An attenuation value is set in response to the value of the supply voltage. The attenuation value is provided to a gain control, along with the input signal. A gain, offset by the attenuation value, determines the gain-adjusted output signal of the gain control generated from the input signal.

21 Claims, 5 Drawing Sheets

CIRCUITS SYSTEMS AND METHODS FOR POWER DIGITAL-TO-ANALOG CONVERTER PROTECTION

BACKGROUND OF THE INVENTION

1. Field of the Invention

The present invention relates in general to digital to analog converters (DAC), and in particular to power dissipation protection in power DACs.

2. Description of the Related Art

Class D audio power amplifiers (APAs) have been used for many years in systems, such as wireline telephony, where high bandwidth is not critical. More recently however, new fabrication techniques, and in particular, new techniques for fabricating power transistors, have made integrated class D APAs possible. This has extended their potential applications to lower-power, higher-bandwidth systems, including battery-powered portable music players and wireless communications devices.

One major advantage of class D amplifiers is their efficiency. Generally, an audio signal is converted into a relatively high frequency stream of pulses varying in width with the amplitude of the audio signal. This pulse width modulated (PWM) signal is used to switch a set of power output transistors between cutoff and saturation which results in efficiencies above ninety percent (90%). In contrast, the typical class AB push-pull amplifier, using output transistors whose conduction varies linearly during each half-cycle, has an efficiency of around sixty percent (60%). The increased efficiency of class D amplifiers in turn reduces power consumption and consequently lowers heat dissipation and improves battery life in portable systems.

As previously described, in a class D amplifier, efficiency is gained by switching the power devices hard between the power supply rails. The high frequency noise is then filtered with a low pass filter. Typically, the low pass filter is of the passive type, including inductive and/or capacitive reactive elements to smooth the signal. FIG. 1 illustrates, in block diagram form, a typical class D amplifier system 100. Amplifier system 100 includes class D amplifier 102 containing MOSFET switch 104 and delta-sigma ($\Delta\Sigma$) converter/PWM controller 106 receives a digitized audio input signal, which constitutes the signal to be amplified. The digital input signal may be high resolution, low data rate data, which may be converted to low resolution, high data rate data by delta-sigma converter portion of delta-sigma converter/PWM 106. MOSFET switch 104 may constitute a full bridge amplifier. The duty cycle of the PWM signal is proportional to the (quantized) amplitude of the audio signal. In other words, for each sample period, the relative time duration of the "high" and "low" levels of the PWM signal into MOSFET switch 106 are proportional to the quantized amplitude of the audio signal, and consequently the relative time intervals during which the output of the amplifier, ahead of LPF 110, is pulled up and pulled down is similarly proportional to the audio signal amplitude. (PWM signal generation techniques are discussed in the commonly owned U.S. Pat. No. 5,815,102 to Melanson, entitled "Delta-sigma PWM DAC to Reduce Switching," incorporated herein by reference.) The amplified audio is recovered via low pass filter (LPF) 110, which provides the audio output to a load, Z. The high efficiency of class D amplifiers, and their associated pulse width modulation (PWM) driving schemes, permits relatively large amounts of audio power may be delivered by an amplifier occupying a relatively small physical footprint. Indeed, an integrated circuit class D power amplifier (including its associated signal processing and modulator) may deliver at approximately fifteen watts to an 8 ohm load, for example, a speaker for such an amplifier at a supply voltage of approximately 16 volts, and approximately fifty-eight watts for a 16 volt split supply voltage (±16 volts). However, particular user applications may operate at different voltages, and with different load impedances. Consequently, it is desirable to incorporate a mechanism to limit the power that may be delivered to a load, in selected circumstances, to protect either the load, the amplifier device itself, or both. Traditional current limiting protections schemes, based, for example, on a measurement of the output current through a voltage drop across a resistor inserted in series with the load, are inefficient, and complicated to implement, because of common-mode rejection requirements. Consequently, there is a need in the art for systems and methods to protect components in power DAC systems having reduced power losses and implementation cost and space penalties.

SUMMARY OF THE INVENTION

According to the principles of the present invention, a gain control apparatus is disclosed that a gain control includes a first input operable for receiving a selected attenuation value set in response to a value of the supply voltage. The gain control is configured to receive an input signal at a second input, and generate a gain-adjusted output signal in response to the input signal. The gain value of the gain-adjusted output signal is offset by an attenuation corresponding to the selected attenuation value.

The inventive concept addresses a problem in power DAC amplifier systems, namely, protection of amplifier and system components from excessive power dissipation, or overdrive in a system that may be operated over a range of supply voltages. Conventional power DAC, switched-mode systems use internal current limiting to protect on-chip components and external current limiting to protect off-chip components, such as speakers or headphones. These increase the cost, as well as the footprint, of the system to accommodate current sensing components and circuitry associated therewith for measuring the current output by the amplifier. The gain offset by the attenuation value selected in response to the value of the supply voltage, limits the drive from the power DAC system.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 illustrates, in block diagram form, a portion of a digital volume control apparatus, which may be used in the apparatus of FIG. 2 and FIG. 5; and.

DETAILED DESCRIPTION

Figure 1:
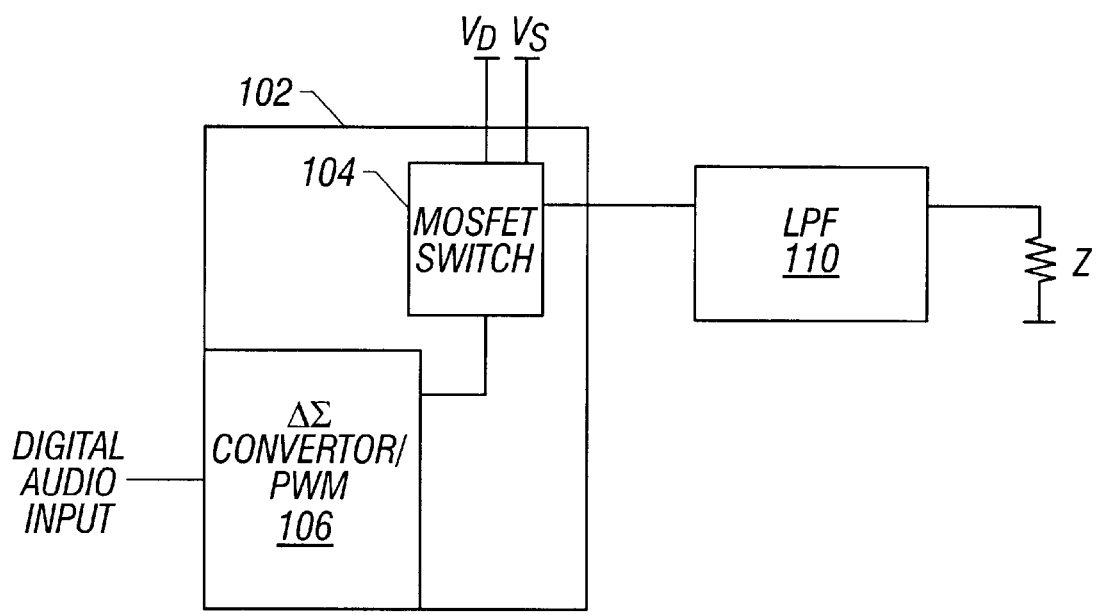
FIG. 1 illustrates, a class D amplifier system which may be used with an embodiment of the present invention.

In the following description, numerous specific details are set forth, such as specific gain values, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 2:
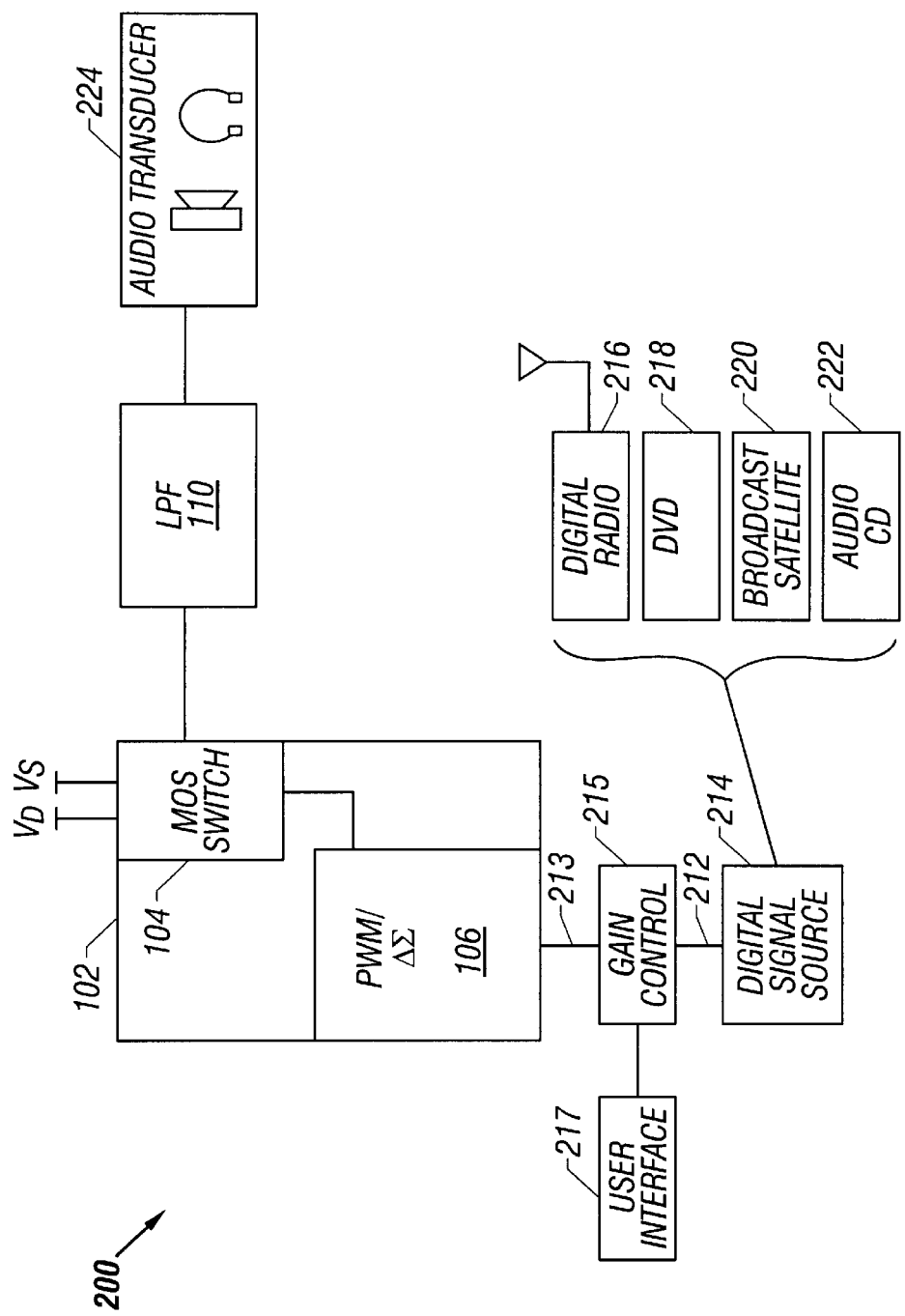
FIG. 2 illustrates, in block diagram form, an audio system in accordance with the principles of the present invention.

Refer now to FIG. 2 illustrating an audio amplifier system 200 in accordance with the principles of the present invention. System 200 includes amplifier 102, digital audio source 214 and audio transducer 224. Amplifier 102 includes, in addition to switch 104, interpolator 219 and pulse-width modulator/delta-sigma converter 106. Amplifier 102 also includes gain control 215 which receives a digital signal 212 which may be a digital audio signal. Digital signal 212 may be a conventional pulse code modulated (PCM) digital representation of an analog signal. System 200 may also include a user interface 217 coupled to gain control 215 for user control of the gain of audio system 200. User interface 217 may output a digital value to gain control 215 in an embodiment of system 200 in which gain control 215 constitutes a digital gain control. Gain-adjusted digital signal 213 is provided to amplifier 102. An apparatus for such a digital gain control which embodies the principles of the present invention will be discussed further in conjunction with FIG. 3. User interface 217 may, for example, include a rotary optical encoder, or similar mechanism, for providing digital gain control value to gain control 215 in response to a user input. Such an interface may present an appearance and mode of operation to the external user that is similar to a conventional analog volume control. However, an artisan of ordinary skill in the relevant art would recognize that such an implementation of user interface 217 is not necessary to the present invention, and alternative user interfaces, via a graphical user interface (GUI) or other user interface may be used with the present invention, and such embodiments would fall within the spirit and scope thereof. Digital signal source 214 may include one or more of a digital radio 216, digital video disk (DVD) player 218, direct broadcast satellite 220, or audio compact disk (CD) 222.

Figure 3:
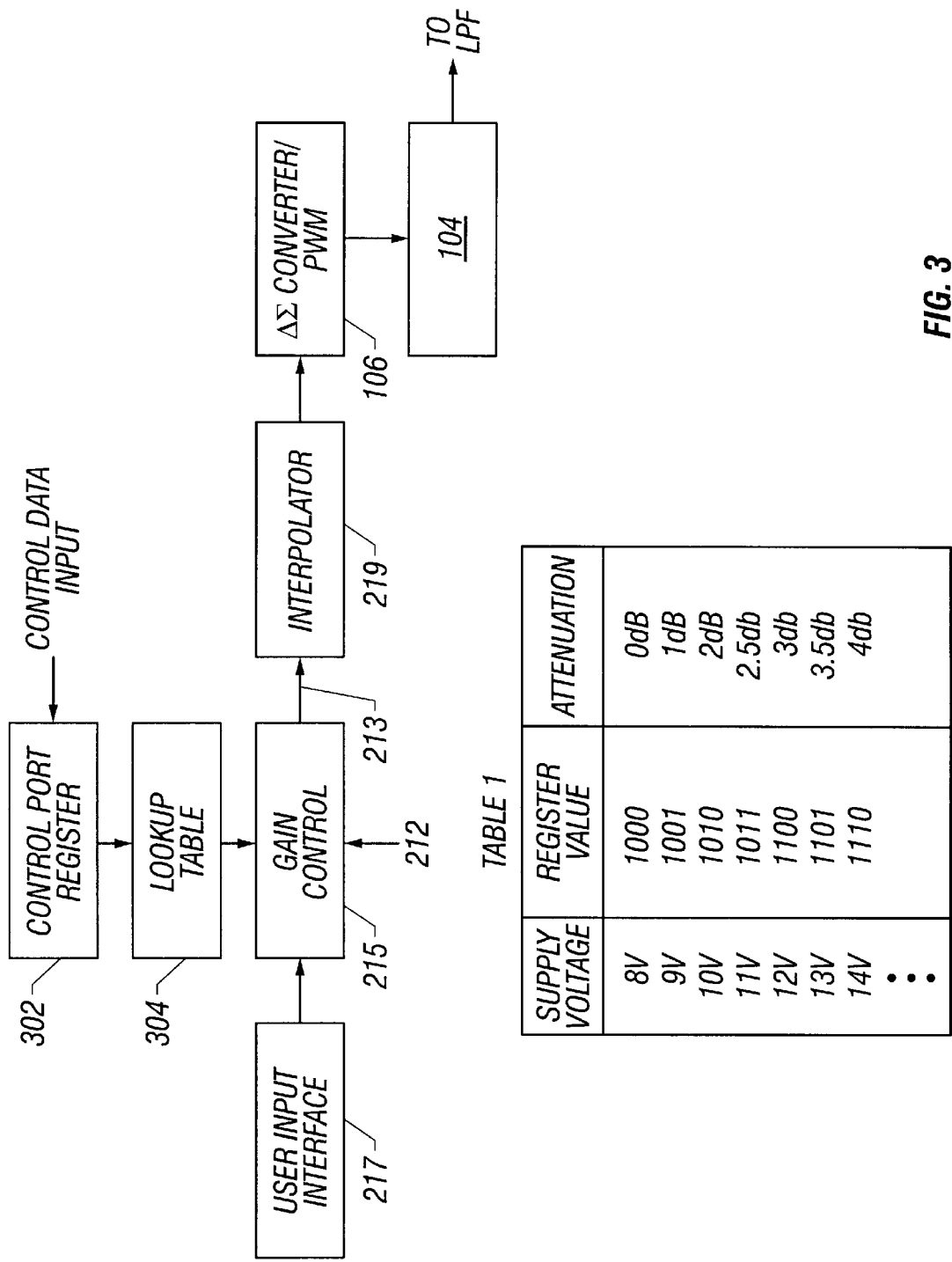
FIG. 3 illustrates, in block diagram form, a gain control apparatus in accordance with an embodiment of the present invention which may be used in the system of FIG. 1.

Refer now to FIG. 3 illustrating a portion of audio amplifier system 200 in further detail. In accordance with the principles of the present invention, control port register 302 contains a data value for indexing into lookup table 304. The data value setting control port 302 is set by the manufacturer of the audio system, such as audio system 200, in accordance with the principles of the present invention. The value that is set is a function of the supply voltage provided to the amplifier in accordance with the specifications of the audio system as determined by the manufacturer. The value may also be a function of the characteristics of the load specified by the manufacturer to be used in the audio system, that is, the impedance or range of impedances, that are specified for use in the system. Lookup table 304 includes a set of data values which maps to a corresponding attenuation set in gain control 215. Thus, gain control 215 introduces an attenuation into the audio input signal (in digital form) in response to the data values set in control register 302.

An exemplary mapping of register data values and corresponding attenuations, and the supply voltage with which the corresponding attenuation may be selected is illustrated in Table 1. It would be understood by one of ordinary skill in the relevant art that Table 1 is illustrative and that other supply voltage ranges may also be implemented, and such alternative embodiments would fall within the spirit and scope of the present invention. It would also be understood that in the implementation of the lookup table, attenuation values may be digitally represented, and may be realized as a negative value.

Digital signal 212 is input to gain control 215, and in response to a digital representation of the user selected gain from user interface 217, and the output of lookup table 304, generates a digital output signal 308 that corresponds to the digital representation of the audio input signal, digital signal 212 increased by the net gain that results from the user selected gain and offset by the attenuation introduced by the output of the lookup table. In other words, gain control 215 may be effected by a multiplier that multiplies the digital audio input signal 212 by the user selected gain offset by any attenuation introduced via the value in control port register 302 and lookup table 304. In this way, protection for the driver, and load may be effected by limiting the drive capability of the audio system.

Output signal 213 from gain control 215 is provided to interpolator 219. Interpolator 219, and the delta-sigma converter portion of delta-sigma converter/PWM 106 (FIG. 2) provide oversampling of the gain-adjusted digital signal 213, raising the sample rate of the signal, and converting the typically high resolution, low data rate digital audio signal to a low resolution high data rate signal for conversion to an analog output. The PWM portion of delta-sigma converter/PWM 106 provides a digital output signal whose duty cycle corresponds to levels of the high data rate, low resolution output of the delta-sigma converter portion. The PWM drives switch 104 (FIG. 2), which may be a class D switching amplifier stage. As previously described, the attenuation introduced via control port register 302, lookup table 304, and gain control 215 operates to reduce the power dissipated in the driver, as well as the load. As the supply voltage is increased, the attenuation may be selectively increased via the data value in the control register to protect system components.

Figure 4:
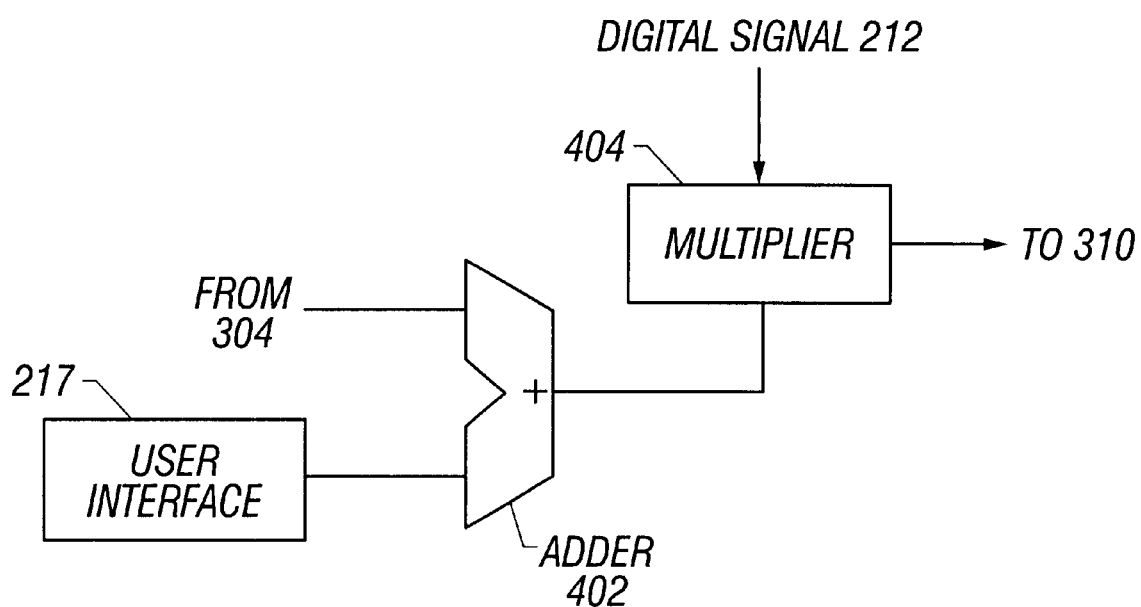

Digital volume control that may be used in the present invention is illustrated in FIG. 4. Adder 402 (algebraically) sums the digital attenuation value from lookup table 304 with the user selected gain from user interface 217. The sum is output to multiplier 404 and provides the multiplier for the multiplicand, digital signal 212 from digital signal source 214, FIG. 2. The product is output to interpolator 219, FIG. 3. Note that the digital attenuation values contained in lookup table 304 may be selected, as a function of supply voltage, so that amplifier drive, at the maximum value of the attenuation offset gain, does not exceed a preselected power.

Figure 5:
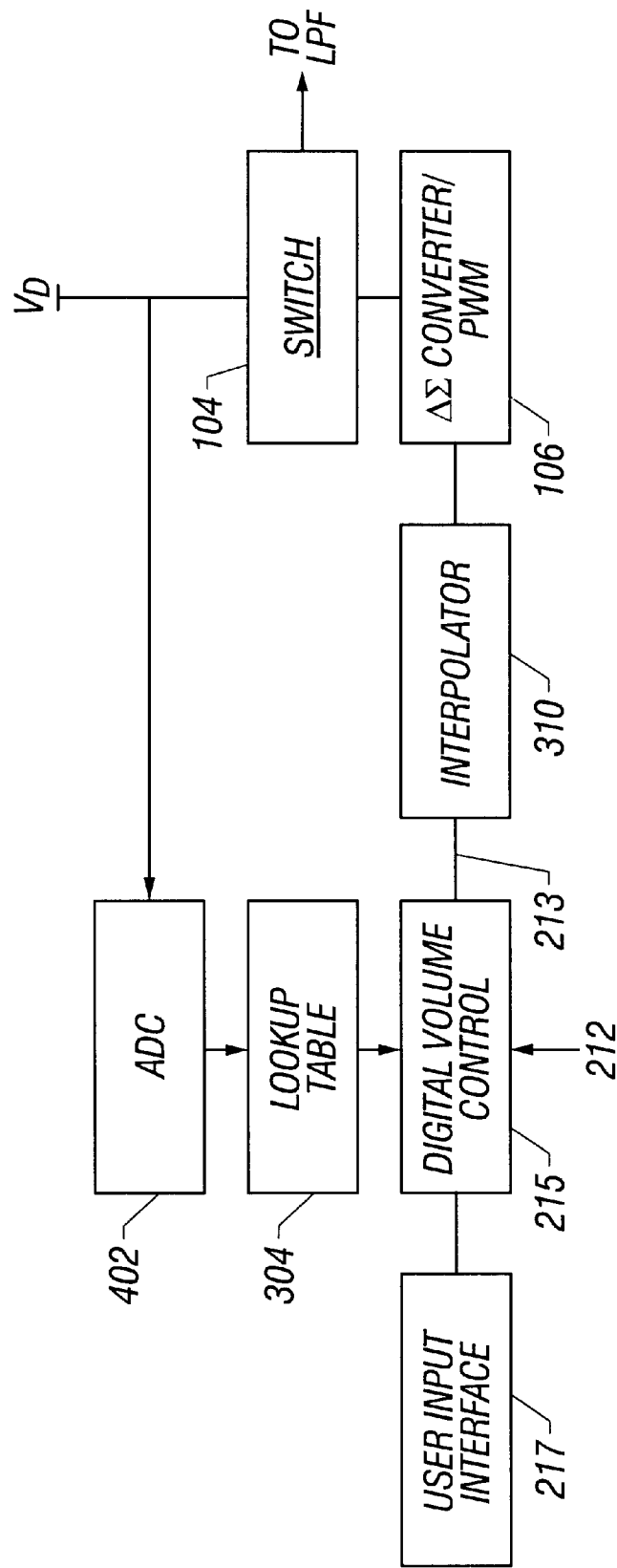
FIG. 5 illustrates, in block diagram form, an alternative embodiment of a gain control apparatus which may be used in the system of FIG. 1.

Refer now to FIG. 5 illustrating a portion of audio system 200 in accordance with an alternative embodiment of the present invention. The supply voltage, $V_D$ is input to analog-to-digital converter (ADC) 502. ADC 502 outputs a digital value corresponding to the value of the supply voltage, $V_D$. The value output may also correspond to the register value, previously discussed hereinabove in conjunction with FIG. 3. The value output from ADC 502 provides an index into lookup table 304. The operation of gain control 215, user input interface 217, interpolator 219 and delta-sigma converter/PWM 106 and switch 104 is as described in conjunction with these elements in the embodiment of FIG. 3. Thus, the apparatus of FIG. 5 limits the drive in response to the value of the supply voltage, $V_D$, and thus, protects the components in the amplifiers system in accordance with the attenuation mapping of lookup table 304. In this way, the apparatus of FIG. 5 automatically responds to the provided supply voltage to protect the system components.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed may be readily used as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. A gain control apparatus comprising:
    a gain control having a first input operable for receiving a selected attenuation value set in response to a supply voltage value, said gain control configured to receive an input signal at a second input, and generate a gain-adjusted output signal in response to said input signal, wherein a gain value of said gain-adjusted output signal is offset by an attenuation corresponding to said first attenuation value.

2. The apparatus of claim 1 further comprising an analog-to-digital converter (ADC) configured to output a digital value corresponding to said supply voltage value, said selected attenuation value selected in response to said digital value.

3. The apparatus of claim 1 further comprising a register configured to receive a data value corresponding to said supply voltage value, said selected attenuation value selected in response to said data value.

4. The apparatus of claim 2 further comprising a lookup table including a plurality of attenuation values, said lookup table configured to output said selected attenuation value, wherein said selected attenuation value is selected from said plurality of attenuation values in response to said digital value.

5. The apparatus of claim 4 wherein said selected attenuation value is selected using an index into said lookup table, a value of said index corresponding to said supply voltage value.

6. The apparatus of claim 1 further comprising a lookup table including a plurality of attenuation values, said lookup table configured to output said selected attenuation value, wherein said selected attenuation value is selected from said plurality of attenuation values in response to said supply voltage value.

7. The apparatus of claim 3 further comprising a lookup table including a plurality of attenuation values, said lookup table configured to output said selected attenuation value, wherein said selected attenuation value is selected from said plurality of attenuation values in response to said data value.

8. The apparatus of claim 7 wherein said selected attenuation value is selected using an index into said lookup table, a value of said index corresponding to said data value.

9. The apparatus of claim 2 wherein said gain control further comprises:
    an adder having a first input configured to receive said selected attenuation value, and a second input configured to receive said gain value; and
    a multiplier configured to receive an output of said adder and said input signal, said multiplier generating said gain-adjusted output signal.

10. The apparatus of claim 3 wherein said gain control further comprises:
    an adder having a first input configured to receive said selected attenuation value, and a second input configured to receive said gain value; and
    a multiplier configured to receive an output of said adder and said input signal, said multiplier generating said gain-adjusted output signal.

11. An amplifier system comprising:
    a digital signal source;
    a gain control coupled to said digital signal source; and
    an amplifier coupled to said gain control, wherein said gain control has a first input operable for receiving a selected attenuation value set in response to a supply voltage value, said gain control configured to receive, at a second input, an input signal and generate a gain-adjusted output signal in response to said input signal, wherein a gain value of said gain-adjusted output signal is offset by an attenuation corresponding to said first attenuation value.

12. The system of claim 11 further comprising:
    an analog-to-digital converter (ADC) configured to output a digital value corresponding to said supply voltage value, said selected attenuation value selected in response to said digital value; and
    a lookup table including a plurality of attenuation values, said lookup table configured to output said selected attenuation value, wherein said selected attenuation value is selected from said plurality of attenuation values in response to said digital value.

13. The system of claim 12 wherein said amplifier comprises a switched-mode amplifier, said system further including a pulse-width modulator configured to drive said switched-mode amplifier in response to a signal derived from said gain-adjusted output signal.

14. The system of claim 13 further comprising:
    an adder having a first input configured to receive said selected attenuation value, and a second input configured to receive said gain value; and
    a multiplier configured to receive an output of said adder and said input signal, said multiplier generating said gain-adjusted output signal.

15. The system of claim 11 further comprising:
    a register configured to receive a data value corresponding to said supply voltage value, said selected attenuation value selected in response to said data value;
    a lookup table including a plurality of attenuation values, said lookup table configured to output said selected attenuation value, wherein said selected attenuation value is selected from said plurality of attenuation values in response to said data value corresponding to said supply voltage value, and wherein said amplifier comprises a switched-mode amplifier, said system further including a pulse-width modulator configured to drive said switched-mode amplifier in response to a signal derived from said gain-adjusted output signal.

16. The system of claim 15 further comprising:
    an adder having a first input configured to receive said selected attenuation value, and a second input configured to receive said gain value; and
    a multiplier configured to receive an output of said adder and said input signal, said multiplier generating said gain-adjusted output signal.

17. A digital-to-analog protection comprising:

setting a selected attenuation value in response to a supply voltage value;

offsetting a gain value by said attenuation value; and setting a gain of a digital signal in response to an offset gain value from said offsetting step, said step of setting said gain of said digital signal providing a gain-adjusted digital signal.

18. The method of claim 17 wherein said step of setting said selected attenuation value comprises the step of indexing into a lookup table including a plurality of attenuation values.

19. The method of claim 18 wherein the step of indexing into said lookup table further includes the step of storing a data value corresponding to said supply voltage value in a register, said data value corresponding to said supply voltage value providing an index value for indexing into said lookup table.

20. The method of claim 18 further comprising the step of generating a digital representation of said supply voltage value, and generating an index value for indexing into said lookup table in response to said digital representation of said supply voltage value.

21. The method of claim 18 wherein said step of offsetting said gain value comprises the step of algebraically summing said gain value and said selected attenuation value, and wherein said step of setting said gain of said digital signal comprises multiplying said digital signal by said offset gain value.

\* \* \* \* \*